United States Patent
Hohe et al.

(10) Patent No.: US 6,639,290 B1
(45) Date of Patent: Oct. 28, 2003

(54) HALL SENSOR WITH A REDUCED OFFSET SIGNAL

(75) Inventors: Hans-Peter Hohe, Heiligenstadt (DE); Norbert Weber, Weissenohe (DE); Josef Sauerer, Herzogenaurach (DE)

(73) Assignee: Fraunhofer-Gesellschaft zur Foerderung, der Angewandten Forschung E.V., Munich (DE)

(*) Notice: Subject to any disclaimer, the term of this patent is extended or adjusted under 35 U.S.C. 154(b) by 0 days.

(21) Appl. No.: 09/914,374
(22) PCT Filed: Jan. 17, 2000
(86) PCT No.: PCT/EP00/00313
§ 371 (c)(1),
(2), (4) Date: Aug. 24, 2001
(87) PCT Pub. No.: WO00/52424
PCT Pub. Date: Sep. 8, 2000

(30) Foreign Application Priority Data

Feb. 26, 1999 (DE) ............................. 199 08 473

(51) Int. Cl.[7] .................. H01L 29/82; H01L 43/04; H01L 43/06
(52) U.S. Cl. ............................. 257/421; 257/414
(58) Field of Search ............. 257/421, 472, 257/627, 426, 414; 324/251

(56) References Cited

U.S. PATENT DOCUMENTS 5,614,754 A * 3/1997 Inoue
6,278,271 B1 * 8/2001 Schott

FOREIGN PATENT DOCUMENTS

| DE | 26 52 322 | 11/1976 | .......... H01L/43/06 |
| JP | 59-129483 A | * 7/1984 | |
| JP | 62-260375 A | * 11/1987 | |
| JP | 1-162386 | 6/1989 | .......... H01L/43/06 |
| JP | 3-211778 | 9/1991 | .......... H01L/43/06 |
| JP | 08102563 | 4/1996 | .......... H01L/43/06 |
| JP | 10223940 | 8/1998 | .......... H01L/43/06 |

* cited by examiner

Primary Examiner—Nathan J. Flynn
Assistant Examiner—Kevin Quinto
(74) Attorney, Agent, or Firm—Glenn Patent Group; Michael A. Glenn; Kirk D. Wong

(57) ABSTRACT

A hall sensor (1) comprises two opposite current supply, contact electrodes (7a, 7b) between which an active area (5) is defined for generating a current flow through the active area and two opposite voltage tapping contact electrodes (7b, 7d) for tapping-off a hall voltage, wherein a portion of the respective contact electrodes facing the active area (5) is formed in such a way that the interfering influence of the contacts on the offset-reduced effect of the spinning current operation is reduced.

22 Claims, 4 Drawing Sheets

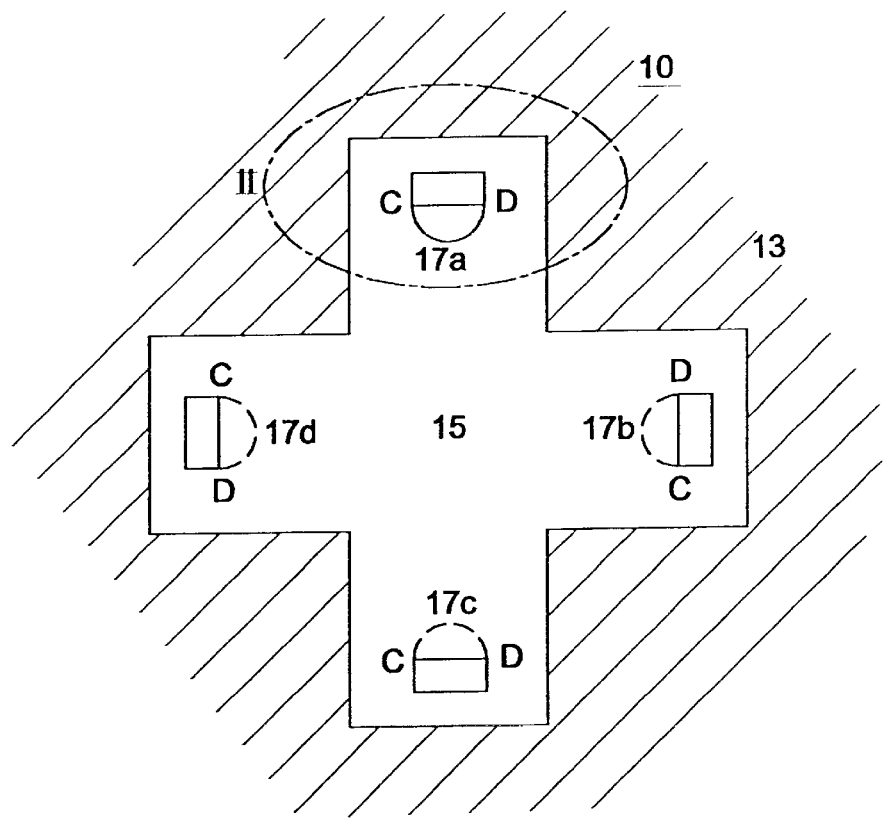
Fig.3a
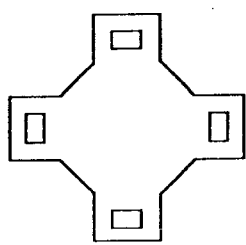    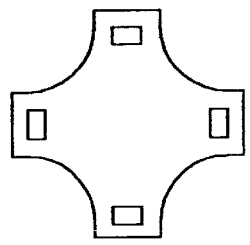    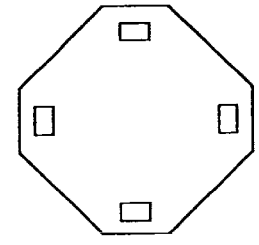
Fig.3b            Fig.3c            Fig.3d

HALL SENSOR WITH A REDUCED OFFSET SIGNAL

The present invention relates to hall sensors and, more particularly, to hall sensors implemented in a CMOS technology with an improved contact electrode geometry for the reduction of the offset signal.

In general, a hall sensor is constructed from an n-doped active semiconductor area on a p-doped semiconductor substrate. Usually, the n-doped active area is connected to an external control logic via four contact electrodes disposed diagonally opposite in the active area. The four contact electrodes are divided into two opposite control current contact electrodes provided to generate a current flow through the active area and, further, into two opposite voltage tapping contact electrodes provided to tap-off a hall voltage occurring perpendicular to the current flow in the active area as a sensor signal in the presence of an applied magnetic field.

Usually, in hall sensors with the arrangement described above, there are two known geometries for the active sensor area illustrated in FIGS. 5 and 6. FIG. 5 shows a square hall sensor 20 whose contact electrodes 22a–d are disposed in the corners of the active area 24, respectively. The shape of the contact electrodes 22a–d of those of this known hall sensor arrangement is normally square. During operation of the hall sensor 20, current is fed between two diagonally opposite contact electrodes 22a, 22c in order to be able to tap-off a hall voltage across the other two contact electrodes 22b, 22d in the presence of an applied magnetic field.

FIG. 6 shows a cross-shaped hall sensor arrangement 30 in the shape of a "Greek cross" in which the rectangular contact electrodes 32a–d reside at the end of a cross arm, respectively, wherein the rear boundary of the contact electrodes 32a–d is identical with the boundary of the active area 34. The width of the contact electrodes 32a–d corresponds to the width of the cross arm, i.e., the contact electrodes 32a–d extend over the whole width of the active area 34 in the respective cross arm. Analogous to the square hall sensor, during operation of the cross-shaped hall sensor, a current is fed between two opposite contact electrodes 32a, 32c in order to be able to tap-off a hall voltage across the two contact electrodes 32b, 32d in the presence of an applied magnetic field.

However, in CMOS processes for the production of semiconductor structures, inhomogeneties or defects in the semiconductor material of the active area occur often due to productional processes. These inhomogeneties cannot be fully avoided even with expensive production methods. These inhomogeneties are, however, often a reason for the ocurrence of an offset of the sensor signal. This means that at the contact electrodes where a hall voltage is tapped-off, a sensor signal is detected, even when no magnetic field is applied to the active area. This interfering sensor signal is referred to as the offset of the useful sensor signal or simply as the offset signal. If those inhomogeneties are in unfavourable positions in the active area, there can be a relatively high offset signal in the known hall sensor elements, since the current lines in the active area can change unfavourably, resulting in a local high resistance in the active area. Thereby the offset of the sensor signal occurring at the hall sensor element depends strongly on the number of inhomogenities and the position of said inhomogenities.

Due to this strong dependency of the offset signal from the inhomogeneties in the conventional hall sensor elements, large exemplary variations occur. Further, the sensitivity and the measurement accurracy of the hall sensors is strongly affected. For this reason, an offset compensation and a correct evaluation of the sensor signals in general, require very expensive circuit technology.

Starting from on this prior art, it is the object of the present invention to provide an improved hall sensor element with a reduced offset in the sensor signal.

This object is achieved by a hall sensor element according to claim 1.

The present invention provides a hall sensor element with two opposite power supply contact electrodes with an active area defined between them for generating a current flow through the active area, and with two opposite voltage-tapping contact electrodes for tapping-off a hall voltage, characterised in that a portion of the respective contact electrode facing the active area is formed in such a way that the interfering influence of the contact electrodes on the offset reduced effect of the spinning current operation is reduced.

The present invention is based on the realization that the offset of the sensor signals occurring in the hall sensor element can be strongly reduced by the appropriate choice, of geometry of the contact electrodes used. Fundamental for a small offset of the sensor signal is namely not only a homogeneous current density distribution of the control current in ideal conditions in the semiconductor material, i.e., without inhomogeneties from which the conventional sensor structures mainly result, but it is of much higher importance how the current density distribution changes because of present inhomogeneties or interferences in the semiconductor material of the active areas and, especially, at the contacts. At the same time, the resulting offset of the sensor signals should be as independent as possible from the position of the inhomogeneties or interferences in the semiconductor material in order to keep the variations of the resulting offset values low.

The advantages of the inventive geometries are based on the following context. The offset that is measurable from the outside of a hall element depends on three fundamental factors:

the strength and extension of the effect in the element;

the operational voltage at the element, and the geometry of the element.

The first two factors are not to be considered any further in this context. In this case, there is only the geometry left for changes. The geometry has far-reaching and numerous influences on the properties of the element. A special connection exists between the contact geometry and the offset of the element reduced by the spinning current explained below.

The spinning current method consists of the fact that the measurment direction is constantly cyclically turned with a certain clock frequency by, for example, 90%, i.e., the operational current flows from one to the opposite contact electrode, wherein the hall voltage is tapped-off at the diagonally-opposite contact electrodes, whereupon in the next cycle, the measurement direction is turned by 90%. The measured hall voltages are summed-up wherein the offset voltages should almost cancel each other in one cycle, so that the portions of the signal that are really magnetic field dependent are left.

Even in the operation without spinning current, positions arise dependent on the chosen element and contact geometry where effects do not interfere and positions where they cause a large offset. A good example is the connecting line between the two control current contacts. Due to symmetry reasons, defects on this connecting line do not lead to an offset. As soon as there is a slight deviation from this line, however, there is immediately a measurable offset at the hall contacts, although the current densities at both points are almost identical and not negligibly small.

During the operation with spinning current such a sensitivity function arises across the location that describes the effects of a defect at a certain position on the offset, depending on the geometry. In the case of finite extended control or hall contacts this function looks relatively complicated. In a normal hall cross, the function possesses zero points on the connecting lines between respectively opposite contacts and, additionally, between the bisectors of the inner area of the cross. The remaining contour and thereby especially the extreme values of this function in the active area can be influenced by the appropriate choice of element and contact geometry. Usually, the locations with high relevance for the offset reside on the edges of the element and the contacts, while the inner area usually have no new local extreme values. Since all other properties of the element can also change due to modification of the geometry, all other properties need to be considered for changes at the contacts.

In the inventive contacts, the geometry was formed in such a way that a low offset with high yields and almost unchanged sensitivity could be achieved.

The effective resolution thereby increases according to the low offset of the element.

Preferred embodiments of the present invention will be described in more detail below with reference to the accompanying drawings. They show:

FIG. 1 a schematic view of a square hall sensor element with inventive contact electrodes;

FIGS. 2a–e schematic views of the different structures of the inventive contact electrodes for a square hall sensor element;

FIG. 3a a schematic view of a cross-shaped hall sensor element with inventive contact electrodes, and FIGS. 3b–d modified forms of the cross structure;

FIGS. 4a–g schematic views of the different structures of the inventive contact electrodes for a cross-shaped hall sensor element;

FIG. 5 a known hall sensor element with a square-active area and conventional contact electrodes, and FIG. 6 a known hall sensor element with a cross-shaped active area and conventional contact electrodes.

Referring to FIG. 1, the general construction of a rectangular hall sensor element 1 is illustrated. On a semiconductor substrate 3, preferably p-doped, a rectangular-active semiconductor area 5, usually n-doped is disposed. In close proximity to the corners of the n-doped active area 5, contact electrodes 7a–d are disposed that are usually obtained by a n+-doping. The contact electrodes 7a–d are disposed diagonally opposite, respectively in the n-doped active area 5 surrounded by the p-doped substrate. The dotted contour of the portions of the contact electrodes 7a–d facing the active area 5 is to indicate further different new structures of the contact electrodes 7a–d that will each be described below in detail with reference to FIGS. 2a–f.

In FIGS. 2a–e, the different perferred geometries of the contact electrodes 7a–d are illustrated. For simplicity of the following description, only one corner area of the hall sensor element 1 enlarged to scale with the contact structure 7a disposed therein (see dotted circle, section 1 in FIG. 1) is illustrated, since the other contact electrodes 7b–d usually have an identical structure and are symmetrically positioned in the other corners of the active area 5. For simplicity of the description, the contact electrodes 7a–d shown in FIGS. 2a–e are formally separated into two portions, i.e., into one portion facing the active area 5 and into one portion turned away from the active area 5. Further, two end points A and B are defined at the contact electrodes 7a–d between which the inventive structures of the contact electrodes 7a–d pass.

In the embodiment of FIG. 2a, the portion of the contact electrode 7a facing the active area 5 is formed as a straight line, so that the contact electrode 7a is formed in the shape of an iosceles triangle.

Figures 2A, 2B, 2C:
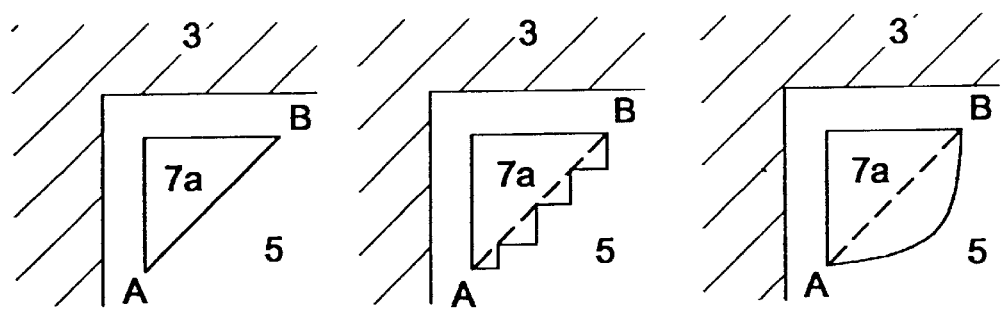
FIG. 2b shows an embodiment for the structure of the contact electrode 7a in which the end points A, B of the portion of the contact electrode 7a facing the active area are connected staircase or step-shaped so that the staircase or step-shaped contour of the contact electrode geometry shown in FIG. 2b is established.
FIG. 2c shows a contact electrode geometry that has a circular segment-shaped structure between the end points A, B curved towards the active area. This curved structure of the contact electrode can also take an elliptic, parabola-shaped or a hyperbola-shaped contour.
Figures 2D, 2E:
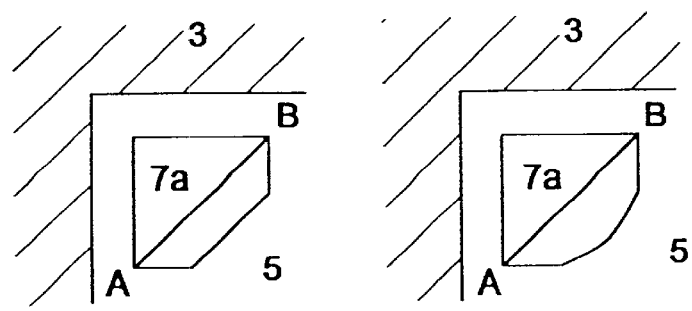

In FIG. 2d, a contact electrode geometry is shown in which the portion of the contact electrode 7a facing the active area has the shape of a isosceles trapezoid, in which the longer baseline of the trapezoid passes between the end points A and B of the contact electrode geometry.

In FIG. 2e, a structure of the contact electrode 7a is illustrated, that is further developed compared to the structure in FIG. 2d in that the shorter baseline of the trapezoid facing the active area 5 has a circular segment shaped, elliptic, parabola-shaped or a hyperbola-shaped contour that is curved in the direction of the active area.

The above-described contact electrode geometries can also be approximated by a polygon train for an exact mathematical description.

It has also been found that the side length of the contact electrodes should be, at the most, 20% of the side length of the active area in order to obtain optimum operational properties of the hall sensor with a significantly reduced offset signal, i.e., so that the current density distribution in the active area of a hall sensor is mainly independent from the position of inhomogeneties or defects in the semiconductor material.

It should further be noted that the structure of the portion of the contact electrodes 7a–d turning away from the active area is not restricted to a triangular contour as shown in FIGS. 2f–f, but can have a shape suitable for the respective case of application, for example, for contacting to the exterior or for leading through the contact electrodes. The contour of the portion of the contact electrodes 7a–d turning away from the active area is not essential for the subject of the present invention.

By means of the above-described new structures for the contact electrodes of a hall sensor element, the unfavourable offset signals that occur, for example, due to production induced inhomogeneties in the semiconductor material of the active area and superimpose the hall voltage signal can be reduced. This improvement is achieved by means of the inventive contact electrode structures in such a way that the resulting offset signal is mainly independent from the position of the inhomogeneties or defects of the semiconductor material. Thereby, exemplary variations can be reduced and the measurement accurracy of the hall sensor elements using the above-described novel contact structures can be improved.

Figure 1:
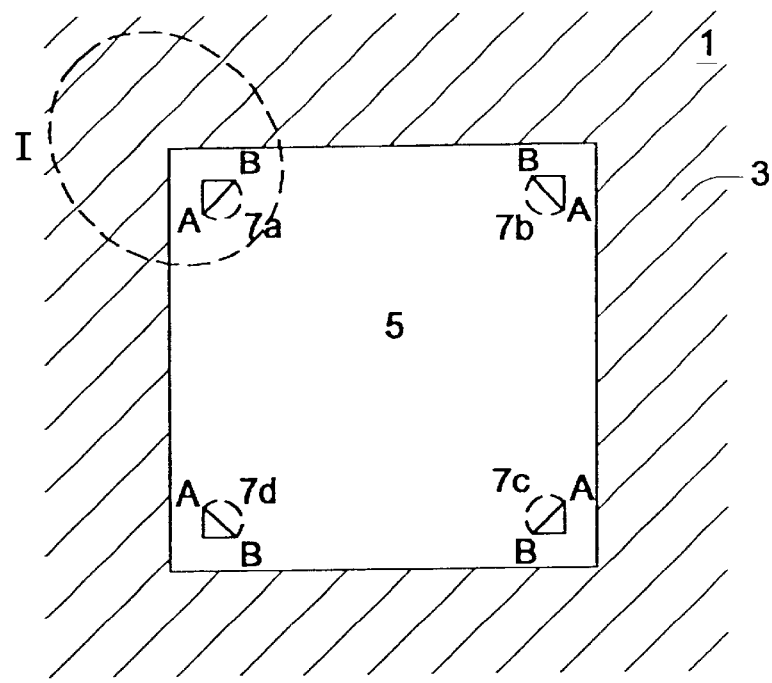

Referring to FIG. 3a, the general construction of a cross-shaped hall sensor element 10 is illustrated. On a semiconductor substrate 13, preferably p-doped, a cross-shaped active semiconductor area 15, usually n-doped, is disposed. Close to the ends of the cross arms of the active area 15, contact electrodes 17a–d are disposed that are, in general, obtained by a n+-class doping. The respective contact electrodes 17a–d that are provided for generating a current flow through the hall sensor element and for tapping-off a hall voltage occurring in the presence of an applied magnetic field, respectively, are disposed in the cross arms symmetrically opposite. The dottedcurve of the portions of the contact electrodes facing the active area is to indicate, corresponding to FIG. 1, further different new structures of the contact electrodes 17a–d that will be described below in detail with reference to FIGS. 4a–g.

Naturally, modified cross-elements can be used, wherein the corners of the element projecting inwardly are varied according to the examples shown in FIGS. 3b–d. FIG. 3d can thereby be seen as a borderline case to a square element.

The different preferred geometries of the contact electrodes 17a–d are illustrated in FIGS. 4a–g. For the simplification of the following description, only one cross-arm of the hall sensor element 10 with the contact structure 17a disposed therein is shown in FIGS. 4a–g (see the dotted circular section 2 in FIG. 3a), since the other contact electrodes 17b–d have an identical structure and are symmetrically disposed in the other cross arms of the active area 15. For the simplification of the description, the contact electrodes illustrated in FIGS. 4a–g are formally separated into two portions, i.e., into a portion facing the active area and into a portion turning away from the active area. Further, there are again two end points, C and D defined between which the inventive structures of the contact electrodes 17a–d pass.

Figure 4A:
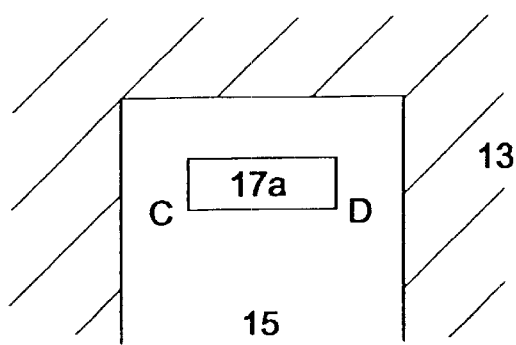

In the easiest case shown in FIG. 4a, the geometry of the contact electrode 17a has a rectangular contour wherein the contact electrode 17a is fully surrounded by n-doped material.

Figure 4B:
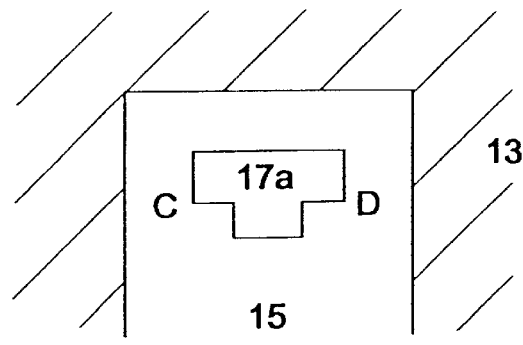

In FIG. 4b, a further possible contour for the portion of the contact electrode 17a facing the active area 15 is illustrated. This contour is formed as a rectangular extension between the end points C, D.

Figure 4C:
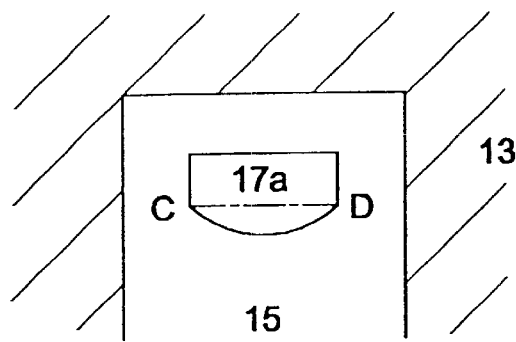

FIG. 4c shows a contact electrode geometry wherein the contact electrode 17a between the end points C, D has a circular segment-shaped contour that is curved towards the active area. The contour can further be elliptic, parabola-shaped or hyperbola-shaped.

Figure 4D:
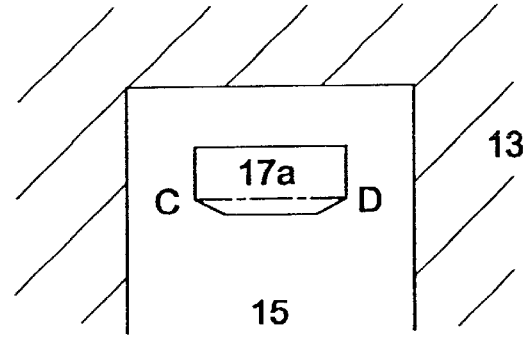

The geometry of the portion of the contact electrode 17a facing the active area can further take on a trapezoid-shaped contour as shown in FIG. 4d, wherein the longer baseline of the trapezoid coincides with an imaginary connecting line between the end points C and D.

Figure 4E:
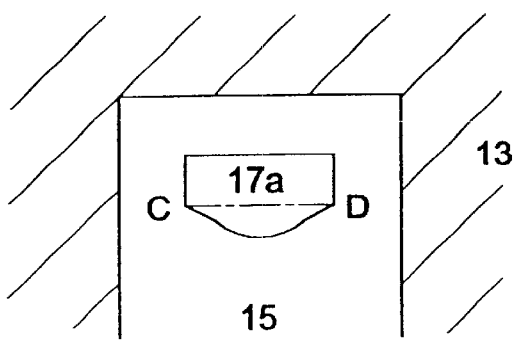
Figure 4F:
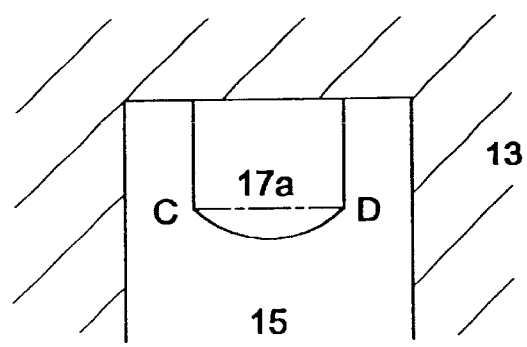

A structure of the contact electrode 17a is illustrated in FIG. 4e that is further developed in comparison with the structure shown in FIG. 4d in such a way that the shorter baseline of the trapezoid has a circular segment-shaped, elliptic, parabola-shaped or hyperbola-shaped contour that is curved in a direction of the active area.

Further structures of the geometries of the contact electrodes as they are shown in FIGS. 4a–g can be that the portion of the contact electrode turning away from the active area extends at least partly up to the p-doped substrate area. One embodiment of such a structure is exemplarily illustrated in FIG. 4f. The circular segment-shaped contour of the contact structure 17a illustrated in this example between the end points C and D can, however, also have all other contact electrode curves illustrated in the FIGS. 4a–e.

Figure 4G:
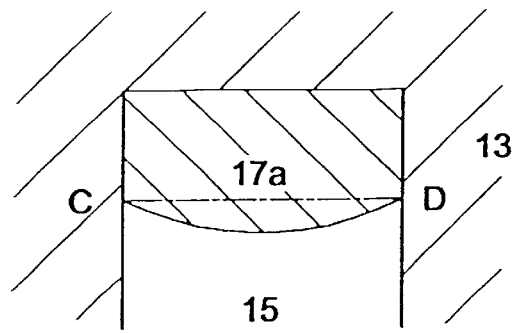
Figure 5:
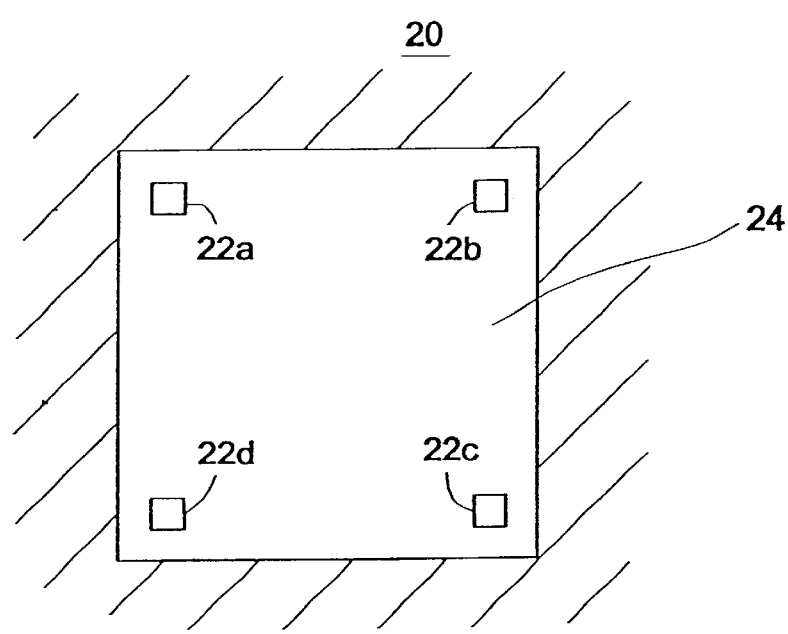
Figure 6:
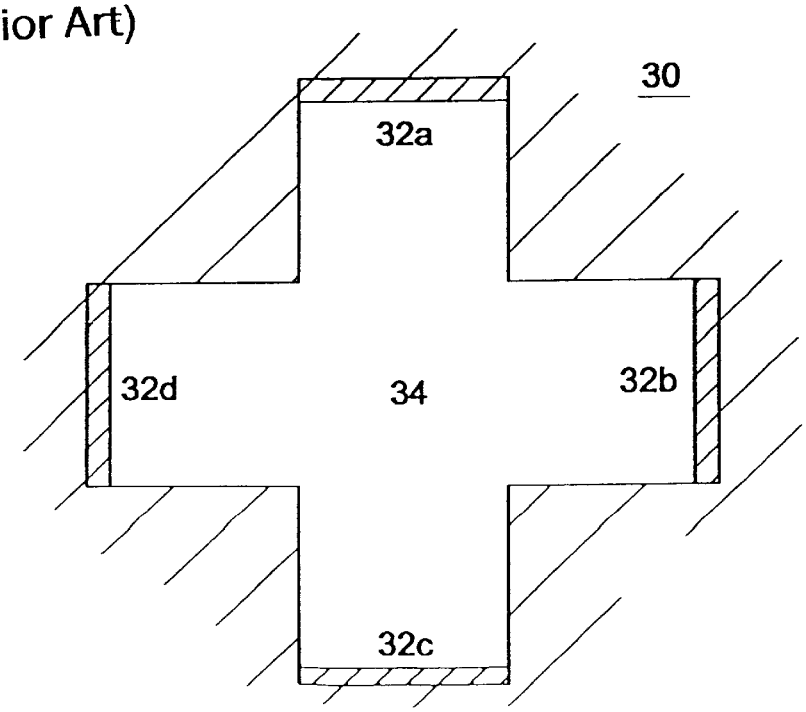

Further, the whole portion of the contact electrode turning away from the active area can be disposed adjacent to the p-substrate as it is shown in FIG. 4g, wherein the width of the contact electrodes matches the width of the active area in the cross arm, i.e., the contact electrode 17a extends across the whole width of the cross arm. The portion of the contact electrode 17a facing the active area can thereby have the curves curved towards the active area 15 illustrated in FIGS. 4b–e.

It should also be noted that the above-described contact electrode structures cannot only be used in hall sensor elements whose active areas have a cross-shaped structure, but these structures can also be used in hall sensor elements whose active areas have a star-shaped contour.

Regarding the contact structures described both according to FIGS. 2a–e with reference to rectangular active areas and contact structures described according to FIGS. 4a–g concerning cross-shaped active areas, it should also be noted that they can be fully in the n-doped area and only be connected to the exterior via a metallization level. The contact areas are, therefore, fully surrounded by the n-doped semiconductor area. Apart from that, there is the possibility that the contact electrodes are not fully in the active semiconductor area as it ist, for example, illustrated in FIGS. 4g–h. This means that at least a boundary of the portion of the contact electrode turning away from the active area can border the boundary of the active area.

Further, it should be noted that the contact electrodes for current supply (7a, 7c; 17a, 17c) and the contact electrodes for voltage tapping (7b, 7d; 17b, 17d) have an identical structure enabling the advantageous use with the so-called "spinning-current" method for offset compensation. The advantages of the inventively-designed contacts are especially noticeable in the spinning current method.

In hall sensors with the conventional contact electrode structures, the offset voltages that occur due to inhomogeneties in the semiconductor material will have different values for each different current flow direction through the active area, so that no satisfying offset suppression can be achieved even when using the above-described compensation method.

By contrast, when using the inventive contact electrode structures a mainly full offset compensation can be expected, since the offset reduced effect of the spinning current operation is far less interferred by the inventive contacts in comparison to the usual contact geometries.

What is claimed is:

1. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two end points of said contact electrodes is, at the most, 20% of the length of said active area.

2. The Hall sensor element according to claim 1, wherein said active area is rectangularly formed and wherein said contact electrodes are disposed in the diagonally opposite corners of said active area.

3. The Hall sensor element according to claim 1, wherein the circular segment-shaped, elliptic, parabola-shaped or hpyerbola-shaped contour of said portion of said contact electrodes facing said active area is curved towards said active area.

4. The Hall sensor element according to claim 1, wherein, at the respective trapezoid-shaped contact electrodes in the shorter baseline of the trapezoid facing said active area, a circular segment-shaped, elliptic, parabola-shaped or hyperbola-shaped contour is provided.

5. The Hall sensor element according to claim 1, wherein said active area has the shape of a regular polygon.

6. The Hall sensor element according to claim 1, wherein said active area is formed cross-shaped and said contact electrodes are disposed in respectively opposite cross arms of said active area.

7. The Hall sensor element according to claim 1, wherein said active area is formed star-shaped and said contact electrodes are disposed in respectively opposite star-arms of said active area.

8. The Hall sensor element according to claim 5, wherein the circular segment-shaped, elliptic, parabola-shaped or hyperbola-shaped contour of said portion of said contact electrodes facing said active area is curved towards said active area.

9. The Hall sensor element according to claim 6, wherein the circular segment-shaped, elliptic, parabola-shaped or hyperbola-shaped contour of said portion of said contact electrodes facing said active area is curved towards said active area.

10. The Hall sensor element according to claim 7, wherein the circular segment-shaped, elliptic, parabola-shaped or hyperbola-shaped contour of said portion of said contact electrodes facing said active area is curved towards said active area.

11. The Hall sensor element according to claim 5, wherein at said respective trapezoid-shaped contact electrodes in the shorter baseline of the trapezoid facing said active area, a circular segment-shaped, elliptic, parabola-shaped or hyperbola-shaped contour is provided.

12. The Hall sensor element according to claim 6, wherein at said respective trapezoid-shaped contact electrodes in the shorter baseline of the trapezoid facing said active area, a circular segment-shaped, elliptic, parabola-shaped or hyperbola-shaped contour is provided.

13. The Hall sensor element according to claim 7, wherein at said respective trapezoid-shaped contact electrodes in the shorter baseline of the trapezoid facing said active area, a circular segment-shaped, elliptic, parabola-shaped or hyperbola-shaped contour is provided.

14. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation wherein all contact electrodes have an identical size, shape, and spatial relationship and are symmetrically disposed referring to said active area, respectively and wherein the side length between said two end points of said contact electrodes is, at the most, 20% of the length of said active area, wherein the circular segment-shaped elliptic, parabola-shaped or hyperbola-shaped contour of said portion of said contact electrodes facing said active area is curved towards said active area.

15. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two end points of said contact electrodes is, at the most, 20% of the length of said active area, wherein, at the respective trapezoid-shaped contact electrodes in the shorter baseline of the trapezoid facing said active area, a circular segment-shaped, elliptic, parabola-shaped or hyperbola-shaped contour is provided.

16. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage, wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two endpoints of said contact electrodes is, at the most, 20% of the length of said active area, wherein said active area is formed star-shaped and said contact electrodes are disposed in respectively opposite star-arms of said active area.

17. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage, wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two endpoints of said contact electrodes is, at the most, 20% of the length of said active area, wherein said active area has the shape of a regular polygon and wherein the circular segment-shaped, elliptic, parabola-shaped or hyperbola-shaped contour of said portion of said contact electrodes facing said active area is curved towards said active area.

18. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two end points of said contact electrodes is, at the most, 20% of the length of said active area, wherein said active area is formed cross-shaped and said contact electrodes are disposed in respectively opposite cross arms of said active area and wherein the circular segment-shaped, elliptic, parabola-shaped or hyperbola-shaped contour of said portion of said contact electrodes facing said active area is curved towards said active area.

19. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two end points of said contact electrodes is, at the most, 20% of the length of said active area, wherein said active area is formed star-shaped and said contact electrodes are disposed in respectively opposite star-arms of said active area, and wherein the circular segment-shaped, elliptic, parabola-shaped or hyperbola-shaped contour of said portion of said contact electrodes facing said active area is curved towards said active area.

20. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two end points of said contact electrodes is, at the most, 20% of the length of said active area, wherein said active area has the shape of a regular polygon, and wherein at said respective trapezoid-shaped contact electrodes in the shorter baseline of the trapezoid facing said active area, a circular segment-shaped, elliptic, parabola-shaped or hyperbola-shaped contour is provided.

21. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-off a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two end points of said contact electrodes is, at the most, 20% of the length of said active area, wherein said active area is formed cross-shaped and said contact electrodes are disposed in respectively opposite cross arms of said active area, and wherein at said respective trapezoid shaped contact electrodes in the shorter baseline of the trapezoid facing said active area, a circular segment-shaped, elliptic, parabola-shaped or hyperbola-shaped contour is provided.

22. A Hall sensor element comprising an active area and contact electrodes, wherein said contact electrodes are formed by two opposite current supply contact electrodes between which said active area is defined for generating a current flow through said active area and by two opposite voltage-tapping contact electrodes for tapping-oft a hall voltage; and wherein a portion of said contact electrodes facing said active area and being adjacent to said active area extends between two end points and has a geometry between said two end points that is step-shaped, circular segment-shaped, elliptic, parabola-shaped, hyperbola-shaped or trapezoid-shaped or has a rectangular extension, in order to reduce the interfering influence of said contact electrodes on the offset-reducing effect of the spinning current operation, wherein all contact electrodes have an identical size, shape, and spatial relationship and are symmetrically disposed referring to said active area, respectively and wherein the side length between said two end points of said contact electrodes is, at the most, 20% of the length of said active area, wherein said active area is formed star-shaped and said contact electrodes are disposed in respectively opposite star-arms of said active area, and wherein at said respective trapezoid-shaped contact electrodes in the shorter baseline of the trapezoid facing said active area, a circular segment-shaped, elliptic, parabola-shaped or hyperbola-shaped contour is provided.

* * * * *